US 10,847,963 B2

(12) United States Patent
Pullmann (10) Patent No.: US 10,847,963 B2
(45) Date of Patent: Nov. 24, 2020

(54) SAFETY CIRCUIT ARRANGEMENT FOR FAILSAFE SHUTDOWN OF AN ELECTRICALLY DRIVEN INSTALLATION (71) Applicant: PILZ GMBH & CO. KG, Ostfildern (DE)

(72) Inventor: Jürgen Pullmann, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 265 days.

(21) Appl. No.: 15/844,856

(22) Filed: Dec. 18, 2017

(65) Prior Publication Data
US 2018/0175604 A1 Jun. 21, 2018

(30) Foreign Application Priority Data
Dec. 20, 2016 (DE) .................. 10 2016 125 031

(51) Int. Cl.
H02H 3/027 (2006.01)
G01R 31/327 (2006.01)
(Continued)

(52) U.S. Cl.
CPC ......... *H02H 3/027* (2013.01); *G01R 31/3278* (2013.01); *G05B 9/02* (2013.01);
(Continued)

(58) Field of Classification Search
CPC ......... F16P 3/00; G01R 31/3278; G05B 9/02; G05B 19/0425; H01H 47/001;
(Continued)

(56) References Cited

U.S. PATENT DOCUMENTS 5,793,309 A * 8/1998 Nellson ................. B60Q 9/008
340/435
7,130,171 B2 * 10/2006 Pullmann ................. G05B 9/03
361/62
(Continued)

FOREIGN PATENT DOCUMENTS

DE           9414079 U1    2/1995
DE    10 2004 016 632 A1   10/2005
(Continued)

OTHER PUBLICATIONS

Farnell[online]. farnell.com [retrieved on Aug. 2009]. Retrieved from the Internet: URL: http://www.farnell.com/datasheets/1835467.pdf (Year: 2013).*

(Continued)

Primary Examiner — Jared Fureman
Assistant Examiner — Nicolas Bellido
(74) Attorney, Agent, or Firm — Harness, Dickey & Pierce, P.L.C.

(57) ABSTRACT

Safety circuit arrangement for failsafe shutdown of an electrically driven installation, comprising a safety switching device, having a safety switching relay that is configured to close or disconnect a power supply path to the installation in a failsafe manner, and a signaling device, having an actuator and a signal generator that is connected to the safety switching device by a first line. The actuator of the signaling device is interchangeable between first and second defined states and the signal generator is configured to generate a first clock signal on the first line only when the actuator is in the first defined state. Furthermore, the safety switching device is configured to draw electrical power from the first clock signal that is greater than or equal to the defined actuating power of the safety switching relay and to convert (Continued)

said electrical power to direct current for actuating the safety switching relay.

15 Claims, 3 Drawing Sheets

(51) Int. Cl.
*G05B 9/02* (2006.01)
*H01H 47/00* (2006.01)
*H01H 50/64* (2006.01)
*H03K 17/97* (2006.01)
*H02H 3/05* (2006.01)
*H02H 5/04* (2006.01)
*H02H 5/12* (2006.01)

(52) U.S. Cl.
CPC ........ *H01H 47/001* (2013.01); *H01H 47/002* (2013.01); *H01H 50/64* (2013.01); *H02H 3/05* (2013.01); *H03K 17/97* (2013.01); *H02H 5/04* (2013.01); *H02H 5/12* (2013.01)

(58) Field of Classification Search
CPC .... H01H 47/002; H01H 47/005; H01H 50/64; H01H 47/004; H01H 47/22; H01H 47/325; H01H 50/18; H01H 50/443; H01H 83/00; H02H 3/027; H02H 3/05; H02H 5/04; H02H 5/12; H02H 11/00; H02H 7/00; H03K 17/97; Y10T 307/76; Y10T 307/826
See application file for complete search history.

(56) References Cited

U.S. PATENT DOCUMENTS

| 8,736,118 | B2* | 5/2014 | Lorenz | H02H 7/00 |
| | | | | 307/326 |
| 2003/0011250 | A1* | 1/2003 | Pullmann | F16P 3/00 |
| | | | | 307/326 |
| 2009/0073628 | A1* | 3/2009 | Nitsche | H01H 47/005 |
| | | | | 361/190 |
| 2013/0113304 | A1* | 5/2013 | Pullmann | H01H 47/005 |
| | | | | 307/326 |
| 2014/0028453 | A1* | 1/2014 | Schwenkel | F16P 3/00 |
| | | | | 340/532 |
| 2018/0366288 | A1* | 12/2018 | Thron | H01F 7/06 |

FOREIGN PATENT DOCUMENTS

| DE | 20 2011 004 483 U1 | 3/2012 |
| DE | 10 2011 054 968 A1 | 5/2013 |
| EP | 2383762 A1 | 11/2011 |
| EP | 2983187 A2 | 2/2016 |

OTHER PUBLICATIONS

European Search Report; dated May 4, 2018; 8 pp.
DIN EN 954-1; Safety-related parts of control systems Part 1: General principles for design; Mar. 1997; 34 pp.
EN ISO 13849-1; Safety of machinery—Safety-related parts of control systems—Part 1: General principles for design; Nov. 2006; 97 pp.
Directive 2006/42/EC of the European Parliament and of the Council of May 17, 2006 on machinery, and amending Directive 95/16/EC (recast) Sep. 6, 2006; 63 pp.

* cited by examiner

SAFETY CIRCUIT ARRANGEMENT FOR FAILSAFE SHUTDOWN OF AN ELECTRICALLY DRIVEN INSTALLATION

CROSS-REFERENCES TO RELATED APPLICATIONS

This application claims priority from German patent application DE 10 2016 125 031.7, filed on Dec. 20, 2016. The entire content of the priority application is incorporated herein by reference.

BACKGROUND OF THE INVENTION

The present disclosure relates to a safety circuit arrangement for failsafe shutdown of an electrically driven installation, comprising a safety switching device and a signaling device. The present disclosure further relates to a corresponding safety switching device and to a corresponding signaling device.

A safety circuit arrangement within the meaning of the present disclosure is a circuit arrangement having at least two interacting components for safeguarding a technical installation, i.e. for preventing accidents which endanger the health or the life of individuals in the region of the installation. One component is a safety switching device, which is specifically configured to interrupt a power supply path to the installation in a failsafe manner in order to bring the installation to a safe, current-less state. The other component is a signaling device or sensor, which is coupled to the safety switching device.

It is important that the safety switching device itself ensures a safe operating state even when faults occur, for instance when electronic components fail, a connection line is damaged or another fault event occurs. Safety switching devices are accordingly generally designed with multi-channel redundancy. More complex safety devices can also have internal monitoring functions to detect individual faults at an early stage and to prevent an accumulation of errors.

The signaling device or sensor supplies the input signals, which are evaluated by the safety switching device and which can optionally be linked to one another, in order to switch on or shut down actuators of the installation, such as an electric drive or a solenoid valve, depending on said input signals. In many cases, the signaling devices deliver fairly simple binary information, for instance whether a mechanical safety door is closed or not, whether an emergency off-switch is activated or not, whether a light barrier is interrupted or not. Furthermore, signaling devices/sensors can also deliver analogue values, for instance the temperature of a boiler or the speed of rotation of a drive. Usually, the safety switching device of the safety circuit arrangement only enables operation of the installation when safe operation can be assumed on the basis of the signals from the signaling devices/sensors.

The requirements placed on a safety circuit arrangement in the sense of the present disclosure are regulated in many countries and are categorized and specified in national and international standards. In Europe, the relevant standards and directives are, for example, Machinery Directive 2006/42/EC or the central safety standard for the design of safety-related parts of control systems for machinery EN ISO 13849-1 as the successor to EN 954-1. A safety circuit arrangement in the sense of the disclosure is in this case intrinsically failsafe in the sense of SIL 2 of the International Standard IEC 61508 and has a performance level of d or higher in the sense of EN ISO 13849-1.

In large installations, there may be a large number of signaling devices/sensors that supply safety-relevant input signals manner to one or more safety switching devices distributed over a wide area. In this case, the signaling devices and sensors are distributed on and around the installation, in what is known as a field, while the safety switching device or devices are usually accommodated centrally in a closed switchgear cabinet, via which the installation is also regularly controlled and supplied with power. The central evaluation and control system enables easy operation and maintenance of the installation but also lead to a high installation and cabling effort, since all safety-critical input signals must be safely and reliably routed from the signaling devices and sensors to the central location. For larger systems, this centralisation often pays off because safety aspects of individual components, such as a splash-proof housing, can be combined for a large number of devices, for example by placing the components in a common closed and splash-proof switch cabinet. A single component can thus meet fewer requirements and be manufactured at lower cost.

In contrast, in average, small or even mobile installations, centralization of this kind is not often worthwhile. Particularly in devices with only one or two signaling devices, each of which monitored by exactly one safety switching device, relocation of the latter away from the installation in a separate switchgear cabinet is not expedient. Centralization of this kind is also not expedient in installations that have to be used and monitored in terms of safety outside of the industrial field in the end-customer sector but where infrastructure conditions such as those prevailing in an industrial production site do not exist. Examples of an installation of this kind are small machines and installations, such as a bread-cutting machine, for example, which is set up in the saleroom of a discount shop and is primarily operated by the end consumer himself.

If centralization of the safety technology is not appropriate, safety circuit arrangements with signaling and safety switching devices are arranged directly on the installation. Due to the arrangement of both components of the safety circuit arrangement directly at the installation, the complex cabling in the field is no longer necessary, but even with this arrangement the signaling device and the safety switchgear are often not designed as one unit, but still as two individual components which must be connected to each other via a cable, even if only a short one. The safety-related requirements for the individual components, and in particular for their interconnection to each other, are the same as for systems with safety switching devices centrally located in a control cabinet that communicate with signaling devices in the field.

In principle, it would therefore be possible to use known safety systems from the industrial field in individual systems as well. However, these systems are often not designed for an application of this kind and have a surplus of functions hat would unnecessarily increase the costs of individual systems. Similarly, the form factors for safety switching devices used in a switchgear cabinet are different to those in safety switching devices that are to be integrated in an individual system. In particular, it is desirable that a safety circuit arrangement for individual systems should be as compact and compact as possible in order to be easily integrated into existing systems.

At the same time, however, the individual systems should also be able to meet the high safety requirements of the relevant standards, as comparable systems having a central evaluation and control system from the industrial field, especially since these systems are often operated by end users and not by trained staff.

SUMMARY OF THE INVENTION

It is an object of the present disclosure to specify a safety circuit arrangement that can be implemented in a cost-effective manner and still enables failsafe shutdown, in particular when the signaling device and safety switching device are physically separated from one another yet within close vicinity to one another. It is further an object to specify a safety circuit arrangement that is space-saving and compact. Further, it is an object to specify a corresponding signaling device and safety switching device.

According to one aspect, there is provided a safety circuit arrangement for failsafe shutdown of an electrically driven installation comprising a safety switching device, which has a safety switching relay with a defined actuating power and which is configured to close or disconnect a power supply path to the installation in a failsafe manner, and a signaling device, which has an actuator and a signal generator and which is connected to the safety switching device by a first line, wherein the actuator is interchangeable between a first defined state and a second defined state, and the signal generator is configured to generate a first clock signal on the first line only when the actuator is in the first defined state, wherein the safety switching device is configured to draw electrical power from the first clock signal that is greater than or equal to the actuating power of the safety switching relay and to convert said electrical power to direct current for actuating the safety switching relay.

Hence, it is an idea to extract the energy required for switching the current path by the safety switching device from the signaling signal of the signaling device, wherein the signal is generated independently of the safety switching device by the signaling device and transmitted to the safety device. In this context, independent means that the signaling device has its own energy source or is directly connected to one. Depending on the status of the actuator the signaling device generates a clock signal with a defined power from this energy source and makes it available at an output.

The clock signal is an alternating variable having an AC voltage, which has a defined RMS value. The safety switching device converts said AC voltage to a direct current having a defined power. If the converted power corresponds at least to the actuating power of the safety switching relay, said safety switching relay is switched on and a power supply path to the technical installation is closed. In contrast, if a DC voltage is applied between the lines or an AC voltage having a lower RMS value or no signal at all, the safety switching relay shuts down or does not even switch on in the first place. The information about the state of the signaling device is therefore encoded in the AC voltage power of the status signal, wherein the power is used at the same time to operate the safety switching device, in particular the safety switching relay.

In contrast to known safety circuit arrangements, the energy for operating the safety switching device is not provided by the safety switching device but by the signaling device. This has the advantage that the safety switching device for switching the current path can be reduced to a minimum amount of components. The safety switching device can therefore be designed in a particularly simple, compact and cost-effective manner. In some exemplary embodiments, the safety switching device is reduced to only a safety switching relay and some electrical components, which convert the AC voltage of the clock signal to direct current and pass said direct current to an excitation coil of the safety switching relay.

Despite the minimal design of the safety switching device, the claimed safety circuit arrangement meets the requirements of a high safety category of the standards mentioned at the outset. This is possible because the signaling device generates the status signal itself and therefore a conventional signal loop from the control device to the signaling device and back can be omitted. Thereby, bypassing the signaling device by means of a cross-connection between the outgoing line and the returning line of a signal loop can effectively be avoided. A short-circuit to an earth potential or to a supply potential also results in the safety switching relay shutting down, since only the AC voltage power is taken into account for switching on and holding the safety switching relay. Potential sources of error of known safety circuit arrangements can thereby be avoided effectively.

Overall, the disclosed safety circuit arrangement is reduced to a minimum of necessary components, yet still it satisfies high safety requirements. The disclosed safety circuit arrangement thus provides a simple and cost-effective alternative to known safety circuit arrangements, particularly when exclusively one signaling device is intended to be linked to one safety switching device.

In a preferred refinement, the safety switching device is configured to use exclusively the power drawn from the first clock signal for energizing the safety switching relay. The safety switching device can thus be designed in a particularly simple manner when the safety switching device uses the clock signal of the signaling device as exclusive power source. In particular, it is possible to dispense entirely with additional terminals and corresponding electrical component parts for receiving an operating voltage. At the same time, it can be prevent that the safety switching relay is accidently switched on by a short-circuit between the operating voltage and the drive circuit of said safety switching relay, even though the signaling device signals a different state. By omitting a separate voltage supply for the safety switching device further potential sources of error can effectively be ruled out.

In a further refinement, the signaling device is connected to the safety switching relay by an additional second line and the signaling device has a first and a second terminal for receiving a supply voltage and a third terminal for supplying the clock signal, wherein the first terminal is connected to the second line and the third terminal is connected to the first line in order to supply a common potential, in particular a common earth potential, and the first clock signal to the safety switching device. In this refinement, the signaling device is therefore coupled to a supply voltage as energy source, in particular to a 24 volt DC voltage that is conventional in automation technology. A pole of the DC voltage, in particular an earth potential, is forwarded to the safety switching device along with the clock signal. Due to a common earth potential supplied in addition to the clock signal, the safety switching device only needs terminals for the first and second line. No further terminals are required. This contributes to a simplified and compact design of the safety circuit arrangement.

In a further refinement, the signal generator is arranged so that an input of said signal generator is connected to the first terminal and the second terminal and an output side of said signal generator is connected to the third terminal. This refinement further simplifies the design of the signaling device. The signal generator can thus be easily integrated into existing signaling devices, particularly when the signal generator is configured as a simple and preferably integrated circuit.

In a further refinement, the actuator has a first and a second operating contact, wherein the first operating contact is connected to the first terminal and the signal generator, and wherein the second operating contact is connect to the signal generator and the third terminal. With this refinement further potential sources of error can be avoided. Since the supply voltage is passed to the signal generator via a break contact and the generated clock signal is passed to the output of the signaling device via a second break contact, faults in the contact set of the actuator can effectively be ruled out, since a short-circuit in the switch set of the actuator would lead in any case to an interruption of the clock signal at the output. Only a partial actuation would have to be monitored in addition.

In a further refinement, the signal generator is an oscillator, in particular a sine-wave oscillator. An oscillator can be realized in a particularly simple and cost-effective manner. The oscillator preferably generates a sinusoidal AC voltage without DC components. Said oscillator is suitable for a particularly efficient refinement of the safety circuit arrangement.

In a further refinement, the safety switching device has a transformer and a rectifier for drawing and converting the electrical power, wherein the primary side of the transformer is connected to the first and second line and the secondary side of said transformer is connected to the rectifier, so that only AC components of the first clock signal are converted to electrical power. This refinement further contributes to a cost-effective realization of the safety circuit arrangement, since no further electrical components are required in addition to the transformer, rectifier and safety switching relay to ensure failsafe shutdown of a technical installation. Since a transformer can transmit only AC components, any DC components or constant voltages applied to the inputs of the safety switching device have no influence on the safety switching relay.

In a further refinement, the first and a second line are each a core of a two-wire line. In this configuration, the signaling device and the safety switching device are connected by a simple two-wire line. Thereby, the safety circuit arrangement can be realized in a particularly cost-effective manner. Due to the preferred design of the safety circuit arrangement, a two-wire line between the two components of the safety circuit arrangement is sufficient to ensure safe shutdown of a technical installation by the safety circuit arrangement.

In a further refinement, the safety switching relay has a holding power that is lower with respect to the actuating power and the signal generator is configured to supply a second clock signal, wherein the safety switching device is configured to draw an electrical power from the second clock signal that is greater than or equal to the holding power of the safety switching relay but is lower than the actuating power and to convert said electrical power to direct current for holding the safety switching relay. This refinement takes into account the fact that a relay usually requires a higher power to drive than to hold the relay armature. The safety circuit arrangement can thus be de-signed in a particularly energy-efficient manner.

The signal generator is preferably configured, when the actuator is shifted from the second to the first state, to supply the first clock signal for a defined period of time, in particular for 20 to 200 ms, and then the second clock signal, as long as the actuator is in the first state. Thus, the signal generator supplies a clock signal having a higher power purely for actuating the relay and a second clock signal having a lower power for continuous operation. Thereby, the safety circuit arrangement can be implemented in a particularly energy-efficient manner. In addition, the safety switching relay is reliably prevented from being unintentionally energized again after shutdown, since only the second clock signal is available and said second clock signal does not provide the required power to switch on the safety switching relay.

In a further refinement, the safety switching device is configured, after the driving of the safety switching relay, to reduce the energy of the first clock signal so that the safety switching device can draw an electrical power from the first clock signal that is greater than or equal to the holding power of the safety switching device but is lower than the actuating power and can convert said electrical power to direct current for holding the safety switching relay. Thus, the safety switching device is configured to reduce the power of the clock signal after switch-on, for example by a resistor which is arranged in a latch circuit of the safety switching relay. The resistor reduces the power available at the relay and hence also the power, which is converted by the relay into heat.

In a further refinement, the relay is a double-armature relay with two separate contact sets but just one coil. This refinement contributes to a further reduction in the costs of the safety circuit arrangement. Using a double-armature relay having two separate contact sets allows a redundant shutdown with a single safety switching relay. Such an arrangement is more favorable than using two safety switching relays connected in parallel to ensure the necessary redundancy.

It goes without saying that the aforementioned features and those yet to be explained below can be used not only in the combination specified in each case but also in other combinations or on their own, without departing from the scope of the present disclosure.

DESCRIPTION OF PREFERRED EMBODIMENTS

Figure 1:
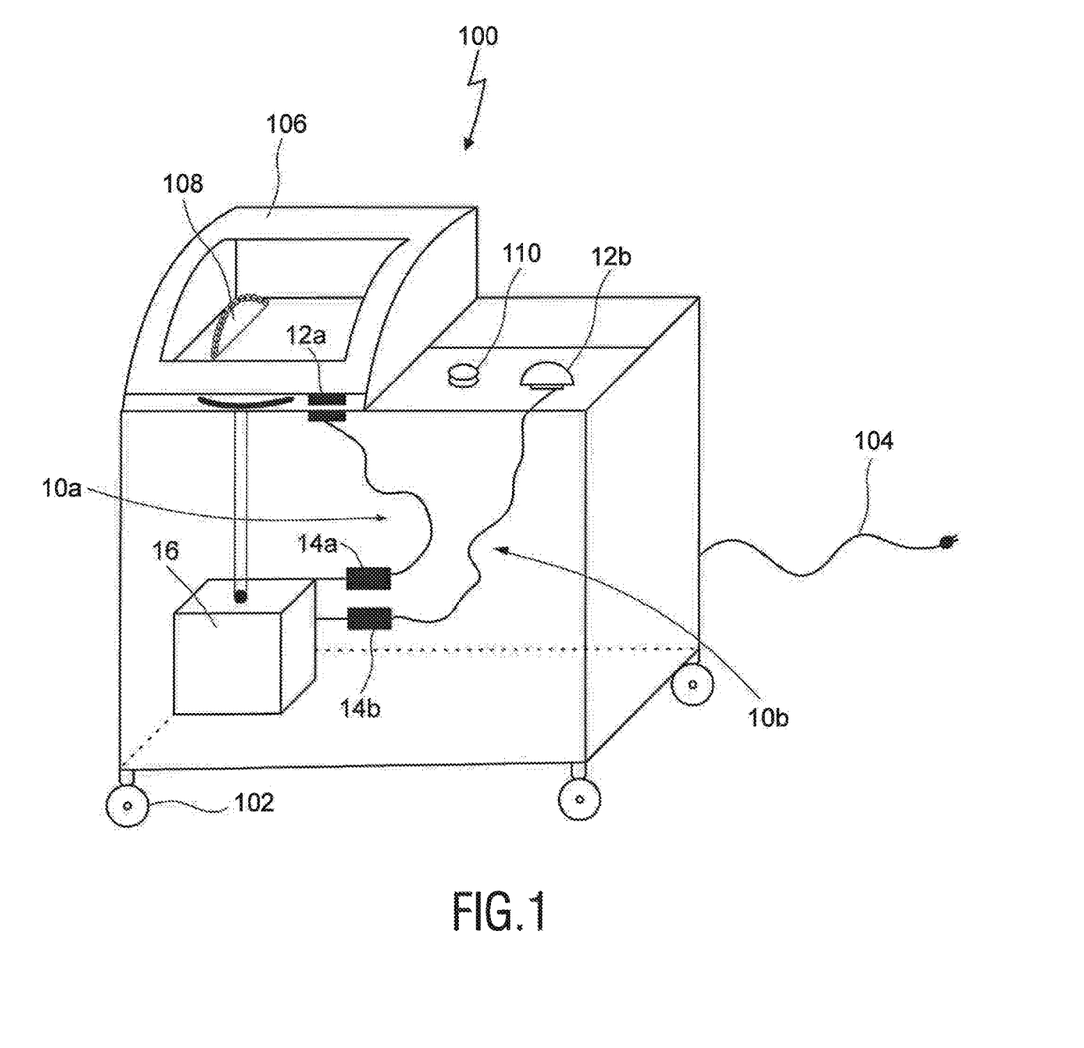
FIG. 1 shows a preferred field of application of the novel safety circuit arrangement.

FIG. 1 illustrates a preferred field of application of the disclosed safety circuit arrangement. Here, a bread-cutting machine is indicated by the reference numeral 100, as can be set up, for example, in the saleroom of a discount shop. In this example, the bread-cutting machine is arranged on castors 102 and is thus able to be moved spatially. The machine is connected to a conventional power supply, for example a 220 volt house supply, and is supplied with power by a plug 104. Furthermore, the bread-cutting machine 100 has a first and a second exemplary embodiment of the novel safety circuit arrangement 10 having respectively a signaling device 12a, 12b and a safety switching device 14a, 14b.

In the machine, behind a cover 106, there is a cutting apparatus 108 driven by a drive 16. To initiate a cutting process, a user opens the cover 106, places a loaf of bread and, after closing the cover 106, and actuates the start button 110. After the cutting process, the user opens the cover 106 and removes the cut bread. It goes without saying that the cutting apparatus 108 may pose a danger to the user during the cutting process if the user reaches into the cutting apparatus 108 during operation.

To protect the user, the cutting process therefore only proceeds when the cover 106 is closed. A first safety circuit arrangement 10a in this case monitors whether the cover 106 is closed. To this end, a signaling device 12a is configured here within the context of the disclosure as a contact switch or magnetic switch and is coupled to the cover 106. The signaling device 12a signals a first state to the safety switching device 14a when the cover 106 is closed and a second state when the cover is open or is being opened. Only when the cover 106 is closed and the safety switching device 14a receives the corresponding signal from the signaling device 12a does the safety switching device 14a permit the start-up of the drive 16. If the corresponding signal is not supplied, the safety switching device 14a shuts the drive down or does not even turn it on.

The second exemplary embodiment 10b comprises an emergency-off switch 12b, which is arranged on the machine 100 and by which a user can manually interrupt the cutting process. The failsafe shutdown of the drive 16 is achieved here in the same manner but by the safety switching device 14b. The interaction of the signaling devices 12a, 12b with the safety switching devices 14a, 14b is explained in more detail below with reference to FIG. 2.

It goes without saying that the machine shown here is just one example of many in which the novel safety circuit arrangement can be applied. The novel safety circuit arrangement is preferably used in individual systems that pose a risk to the user during operation and accordingly have to be secured using one or two safety components. The preferred machines are thus average or small, in particular mobile, installations that are used outside of the industrial field in the end-customer sector. The requirements for the securing of such individual systems are, however, the same as in installations in the industrial field, for example a CNC milling machine.

Figure 2:
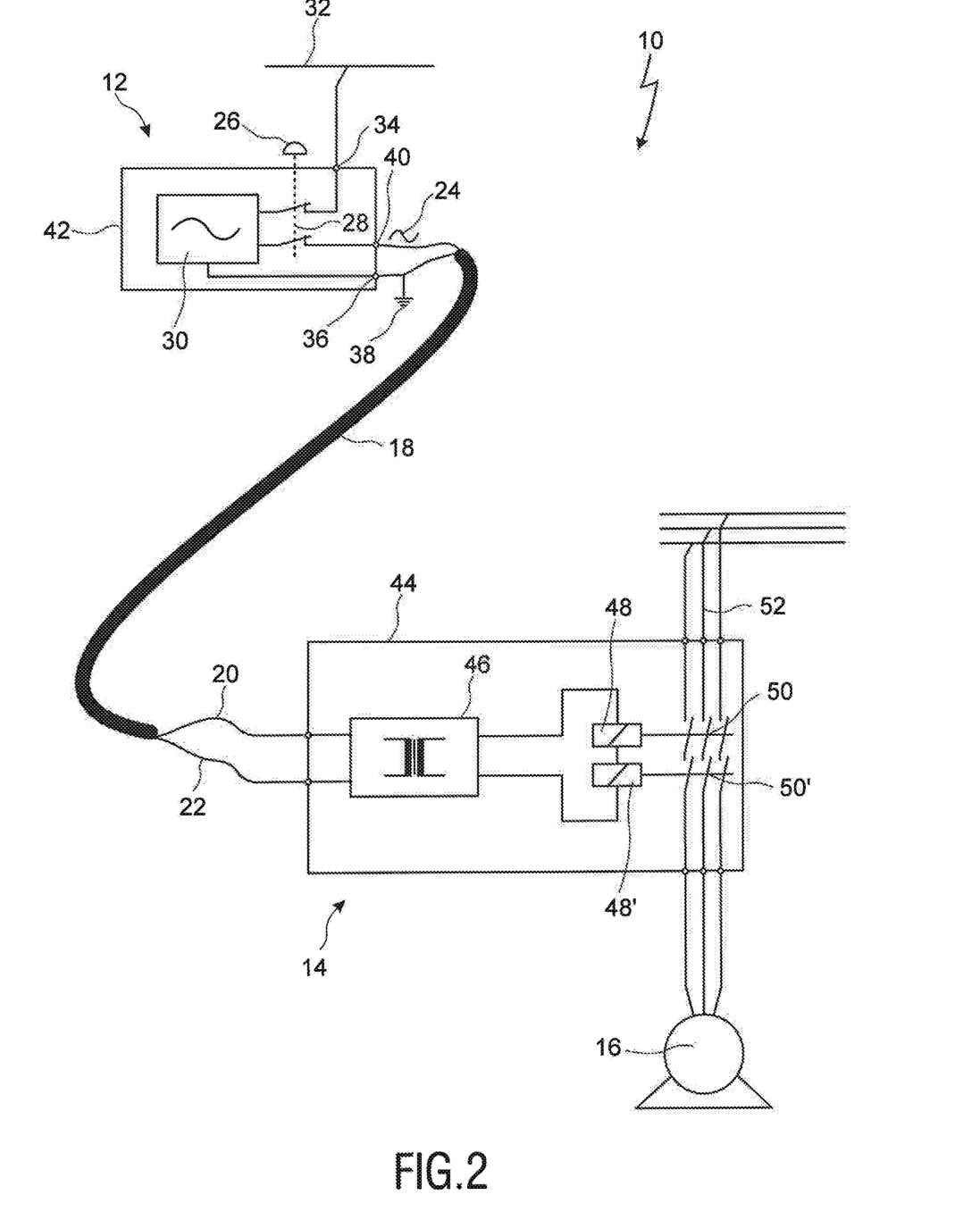
FIG. 2 shows a schematic illustration of a first exemplary embodiment of the novel safety circuit arrangement.

An exemplary embodiment of the safety circuit arrangement is explained in detail with reference to FIG. 2. The safety circuit arrangement is denoted here in its entirety by the reference numeral 10. The safety circuit arrangement 10 contains a signaling device 12 and a safety switching device 14. The two components interact in such a way that a technical installation, indicated here by a motor 16, can be shut down in a failsafe manner. In this exemplary embodiment, the signaling device 12 and the safety switching device 14 are connected by a two-wire line 18 having a first core 20 and a second core 22. The first and second core 20, 22 are thus a first and a second line within the context of the present disclosure.

It goes without saying that a two-wire line, as shown here, illustrates just one option for connecting the signaling device 12 and the safety switching device 14 to one another. However, a two-wire line has the advantage that it can be designed in a particularly expedient manner. In preferred exemplary embodiments, the two-wire line 18 is a very short line within the machine that is to be monitored.

The signaling device 12 is configured to transmit a first clock signal 24 as a status signal to the safety switching device 14. The signaling device 12 has an actuator 26, which is here a hand-operated button. The actuator 26 is preloaded by a spring (not illustrated here) in a first operating position in which an electrical contact 28 is open. In the present exemplary embodiment, this is the inactive rest state (second state) of the actuator 26. The actuator 26 can be moved against the spring to a second operating position in which the normally open contacts 28 are closed. When the operating contacts 28 are closed, a signal generator 30 is connected to an operating voltage 32. The signal generator 30 then generates the clock signal 24, which is illustrated here as a sinusoidal signal. This state is thus a defined first state within the context of the present disclosure. In the exemplary embodiment illustrated here, the signal generator 30 receives the operating voltage required to generate the clock signal only when the actuator 26 is active. Otherwise, said signal generator is not energized. The signal generator 30 thus generates the clock signal 24 only when the actuator 26 is in the defined first state. In the exemplary embodiment illustrated, the actuator is a simple hand-operated switch having one or more operating contacts 28. In other exemplary embodiments, the actuator can have, in particular, one break contact or a combination of break and make contacts. Furthermore, the actuator can be a transponder, a light barrier or a measuring transducer for temperature, pressure or voltage.

The signaling device 12 forms a separate unit but is preferably located in the vicinity of the safety switching device 14 and the drive 16 so that the connection between the signaling device 12 and the safety switching device 14 can be realized by a short wire, preferably within the machine. In other exemplary embodiments, the signaling device 12 can be configured as an emergency-off switch, guard door switch, proximity switch, light barrier, temperature monitor or the like.

In addition to the operating contacts 28, the signal generator 30 is the central element of the signaling device 12. In one preferred exemplary embodiment, the signal generator 30 is an oscillator, which is configured to generate a sinusoidal AC voltage at 10 kHz, for example. A signal generator 30 that generates a sinusoidal AC voltage may be a simple Wien-Robinson oscillator. Here, the oscillator is connected to an operating potential 32 and an earth potential 38 using a first and a second terminal 34, 36, with the result that an operating voltage is dropped between the first and the second terminal. The signal generator 30 supplies the clock signal 24 via a third terminal 40. The first, second and third terminal 34, 36, 40 are preferably realized as connection terminals on a housing 42 of the signaling device 12.

In this exemplary embodiment, the first clock signal 24 is a sinusoidal AC voltage. In other exemplary embodiments, however, the clock signal can also be a different AC variable, for instance a defined pulse signal having a multiplicity of individual pulses. It is essential that the clock signal 24 is configured to transmit a defined power from the signaling device 12 to the safety switching device 14, as is explained in more detail below with reference to the safety switching device 14.

The safety switching device 14 is connected to the signaling device 12 by the two lines 20, 22. The first line 20 is connected to the third terminal of the signaling device and the second line 22 is connected to the second terminal of the signaling device. In other words, the clock signal 24 is transmitted from the signaling device 12 to the safety switching device 14 via the first line 20, while a common earth potential 38 for the signaling device 12 and the safety switching device 14 is supplied via the second line 22. The first and second lines 20, 22 are connected, as in the signaling device 12, by connection terminals on a housing 44 of the safety switching device 14.

The safety switching device 14 monitors the operating state of the signaling device 12 and contains a circuit arrangement and at least one safety switching relay 48. The circuit arrangement is configured as a converter 46, the input side of which is connected to the terminals for receiving the clock signal and the earth potential and the output side of which supplies a DC voltage for driving the safety switching relay 48.

The converter 46 is preferably made up of discrete electrical component parts and configured to draw electrical energy from the first clock signal 24 and to convert said electrical energy to direct current having a defined power. In particular, the converter 46 is configured to draw electrical energy from an AC component of the clock signal 24, while constant components remain unconsidered by the converter 46. Consequently, if no signal, a constant signal or an AC signal having a low RMS value is supplied to the inputs of the safety switching device 14, the converter 46 is not able to supply sufficient power to drive the safety switching relay 48.

The safety switching relay 48 has one or more operating contacts 50, which are arranged in a power supply path 52 to the technical installation 16. When a direct current with a sufficient power is supplied by the converter 46 to drive the safety switching relay 48, the operating contacts 50 of the safety switching relay 48 are closed and the technical installation 16 is connected to a voltage supply. It goes without saying that, in other exemplary embodiments, other actuators, such as a contactor or a solenoid valve, can be driven as well. Furthermore, the safety switching device 14 can have a further safety switching relay 48' connected in parallel with the first relay 48, the operating contacts 50' of said further safety switching relay being in series with the operating contacts 50 of the safety switching relay 48.

Thus, in the disclosed safety circuit arrangement 10 not just a status signal is transmitted from a signaling device 12 to a safety switching device 14 but also the necessary energy to operate the safety switching device 14. Hence, the safety switching device does not need an own voltage supply. The signaling device 12 generates "its own" clock signal and is connected to a voltage supply for this purpose. The clock signal 24 is configured in such a way that it comprises not only information about the present state of the signaling device 12 but also transmits electrical power, which is used by the safety switching device 14 to drive a safety switching relay 48.

Since, in contrast to known safety circuit arrangements, the signaling device 12 does not receive a release signal from the safety switching device 14, the signaling device 12 and the safety switching device 14 can preferably be connected by a simple two-wire connection, wherein all faults, which arise in relation to the connection, such as short-circuits between the cores of the two-wire line, for example, can be dealt with by the safety switching device 14. Furthermore, by suitably interconnecting the signal generator and the operating contacts 28 of the actuator 26, potential sources of error within the signaling device 12 can effectively be ruled out, since the signaling device generates the status signal itself. Therefore, the safety switching device 14 can operate with a minimum amount of, preferably discrete, electrical component parts and still meets the requirements of a high safety category.

The safety circuit arrangement 10 is thus distinguished by the fact that a combination of a signaling device 12 and a safety switching device 14 can be realized in a cost-effective manner and can be easily integrated into existing systems in which a safety infrastructure known from the industrial field is not available. Instead, the novel safety circuit arrangement can preferably be realized within an individual system in a self-sufficient and cost-effective manner. Furthermore, the simple design makes a very compact configuration particularly of the safety switching device 14 possible. This enables new form factors for safety switching devices 14 and thus introduces new possibilities for industrial safety technology in normal end user devices.

A preferred exemplary embodiment of a signaling device 12 and a preferred exemplary embodiment of a safety switching device 14 are explained in more detail below with reference to FIGS. 3 and 4.

Figure 3:
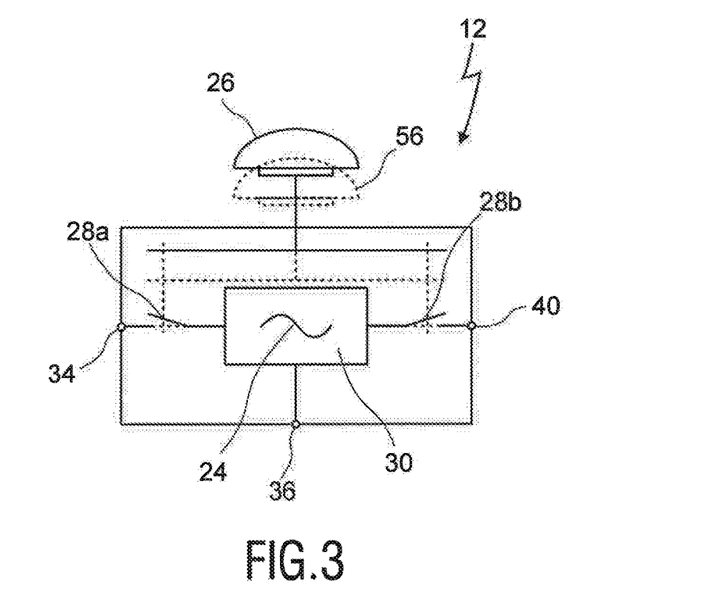
FIG. 3 shows a preferred exemplary embodiment of a novel signaling device.

FIG. 3 shows a preferred exemplary embodiment of a signaling device 12 according to the present disclosure. The signaling device 12 has an actuator 26 and a signal generator 30. The signal generator 30 and the operating contacts 28 of the actuator are arranged in a housing 42. On the outer side of the housing three connection terminals are arranged. The signal generator 30 in the housing 42 is able to be contact-connected by said connection terminals. A first terminal 34 is connected to an operating potential, for example 24 volts DC, and the second terminal 36 is connected to an earth potential. The first clock signal 24 that can be generated by the signaling device 12 is output via a third terminal 40. The signaling device 12 preferably has no further terminals.

The actuator 26 is a hand-operated button, which has a first operating position and a second operating position (indicated here using a dashed line). In this exemplary embodiment, the actuator 26 has a first operating contact 28*a* and a second operating contact 28*b*. The operating contacts 28*a*, 28*b* are set up in such a way that they can only be moved jointly by the actuator 26. The first operating contact 28*a* is arranged between the first terminal and the signal generator 30 and the second operating contact 28*b* is arranged between the signal generator 30 and the third terminal 40. In other words, the actuator 26 can, by the operating contact 28*a*, on the one hand, disconnect the signal generator 30 from the operating potential that is supplied at the first terminal 34 and, on the other hand, prevent the clock signal generated by the signal generator 30 from being emitted at the third terminal 40. The signaling device 12 is therefore set up in such a way that a clock signal 24 is generated at the third terminal 40 only when the actuator is in the second operating position 56.

In a further exemplary embodiment, the signaling device 12 can optionally have a safety state component between the operating contacts 28 and the signal generator 30, said safety state component being configured to influence the signal generator 30 in such a way that said signal generator emits a signal only when both operating contacts 28 have been found to be switched off prior to a restart. As a result, the safety of the apparatus can advantageously be increased further.

The clock signal 24 that is automatically generated by the signal generator 30 when an operating voltage is applied to the terminals 34, 36 is preferably a sinusoidal AC voltage without DC components. Thus, the signaling device 12, on the one hand, generates the clock signal 24 itself and independently of the associated safety switching device and, on the other hand, contains an AC variable from which a specific amount of electrical energy can be drawn. It goes without saying that, in other exemplary embodiments, the clock signal 24 can also have DC components, wherein the energy required for switching is only drawn from the dynamic part of the signal. A feature of the signaling device 12 is therefore a defined RMS value of the clock signal 24 generated by the signal generator 30.

Figure 4:
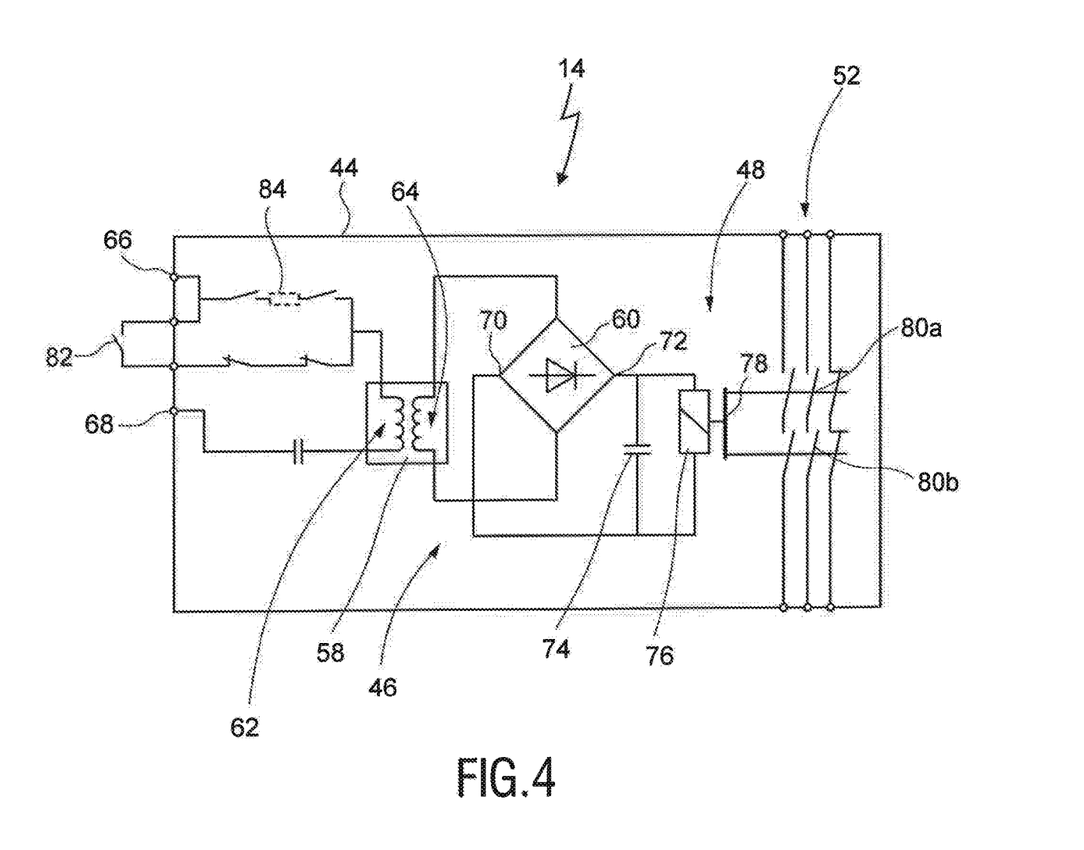
FIG. 4 shows a preferred exemplary embodiment of a novel safety switching device.

FIG. 4 shows a preferred exemplary embodiment of the safety switching device. In this case, the safety switching device likewise has a housing 44, which houses the electrical components of the safety switching device 14. Connection terminals by which the safety switching device 14 can be electrically contact-connected are arranged on the housing 44.

Essential for the safety switching device 14 are a converter 46 and a safety switching relay 48. In this preferred exemplary embodiment, the converter 46 comprises exclusively a transformer 58 and a rectifier 60. The transformer 58 converts an AC voltage applied to the primary side 62 to an AC output voltage, which can be tapped at the secondary side 64. The AC voltage is preferably not transformed from the primary side to the secondary side. A transmission factor of the converter 46 is thus equal to 1. The transformer 58 serves exclusively to transmit just an AC component from the primary side 62 to the secondary side 64, whereas DC components remain unconsidered by the transformer 58. In other words, DC components of a clock signal applied to the inputs 66 and 68 are not transferred to the secondary side 64. The electrical components connected to the secondary side 64 are therefore influenced only by the AC voltage components of the clock signal 24.

In the preferred exemplary embodiment, the rectifier 60 is arranged directly on the secondary side 64 of the transformer 58. The rectifier 60 can be a simple bridge rectifier with four diodes. The rectifier 60 transforms the AC output voltage that can be tapped at the secondary side 64 to a DC voltage applied to the connections 70, 72. A capacitor 74 arranged between the connections 70, 72 smooths and stabilizes the rectified voltage at the connections 70, 72. A exciter coil 76 of the safety switching relay 48 is likewise arranged between the connections 70, 72. If the electrical power transmitted by the transformer 58 is sufficiently high, the exciter coil 76 of the safety switching relay 48 is energized by the voltage applied to the connections 70, 72.

In the preferred exemplary embodiment illustrated here, the safety switching relay 48 has just one exciter coil 76. The single exciter coil 76 can use a double armature 78 to switch two contact sets 80a, 80b that are separated from one another. The operating contacts 80a, 80b are in this case arranged in series in a power supply path 52 and preferably have make and break contacts. By the fact that only one exciter coil 76 is required to switch two separate contact sets, the safety switching device 14 can be realized in a particularly compact and a cost-effective manner, since the relays in safety switching devices often take up a high proportion of the overall costs of the safety switching device.

The safety switching device 14 receives a status signal from a signaling device 12 via the inputs 66, 68. The input 66 is in this case connected to the third terminal 40 of the signaling device 12 and the input 68 is connected to the second terminal 36 of the signaling device 12. The safety switching device thus receives via the input 66 a clock signal 24 as the status signal supplied by the signaling device 12, whereas an earth potential common to the signaling device 12 is received at the input 68. The status signal at the input 66 is transformed by the transformer 58 in the manner described above and the resulting AC output voltage is converted to a constant DC voltage by the rectifier 60 and the capacitor 74. The DC voltage excites the coil 76, with the result that the operating contacts 80a, 80b are actuated by the double armature 78 and the current path 52 is closed.

However, if a DC voltage is applied to the inputs 66, 68, for example on account of a short-circuit within the connection line (not illustrated here) between the signaling device 12 and the safety switching device 14, no AC output voltage is induced on the secondary side 64 of the transformer 58, with the result that the exciter coil 76 is not excited and the make contacts of the operating contacts 80a, 80b are opened.

In this preferred exemplary embodiment, the safety switching device 14 comprises further terminals in addition to the inputs 66, 68 in order to connect a start button 82 to the safety switching device 14. The start button 82 is connected, on the one hand, to the input 66 and, on the other hand, by the break contacts of the operating contacts 80a, 80b, to the transformer 58. Furthermore, in this exemplary embodiment, the input 66 is connected to the transformer 58 by the make contacts of the operating contacts 80a, 80b. A self-latching interconnection of this kind can prevent the technical installation 16 that is to be secured from starting up on its own in the event of a fault. Instead, start-up is only possible when the start button 82 is operated, when a corresponding clock signal 24 is applied to the input 66 and when the break contacts (normally-closed contacts) of the operating contacts 80a, 80b are closed. As soon as the exciter coil 76 is energized and the operating contacts 80a, 80b are connected, the relay 48 self-latches by the make contacts of the operating contacts 80a, 80b closing and the clock signal at the input 66 being guided to the transformer 58 via the make contacts.

In a particularly preferred exemplary embodiment, the exciter coil 76 has a holding power that deviates from the actuating power. The actuating power, for example approximately 0.7 watts, is the power required to energize the double armature 78 and the holding power, for example 0.21 watts, is the power required to hold the double armature in the energized position. In a preferred exemplary embodiment, either the signaling device 12 or else the safety switching device 14 itself can reduce the power of the clock signal 24 after the relay 48 has been energized. For this purpose, the safety switching device 14 can optionally provide a resistor 84 in the holding circuit.

If the signaling device performs a reduction operation, the signal generator 30 of the signaling device 12 first supplies a first clock signal having a first RMS value and then, after the double armature 78 has been energized, a second clock signal having a second RMS value, wherein the second RMS value is lower than the first RMS value. In addition to an energy saving and a reduction in the power loss, which is converted to heat by the coil 76, safety can furthermore additionally be increased, since the energy required to actuate the coil 76 is supplied only for a defined period of time, for example a period of time of 20 to 200 milliseconds after the start of the installation. Accidental start-up of the machine can therefore be prevented effectively.

In the exemplary embodiment illustrated here, the safety switching device 14 does not require any further terminals for receiving a supply voltage, since the energy required for switching is drawn exclusively from the clock signal 24 of the signaling device 12. Furthermore, the safety switching device 14 does not require any further electrical components for the failsafe isolation of the power supply path 52. The entire safety switching device 14 can therefore be realized in a very compact manner. In one exemplary embodiment, the entire electrical circuit arrangement can be arranged on a printed circuit board on the rear side of a double-armature relay. The entire safety switching device 14 can then have the external shape of a rectangle with dimensions smaller than 1 cm×3 cm×6 cm.

As well as the cost-effective realization, the reduction of the required components to a minimum permits a very compact design and hence novel structural designs that are uncommon in safety technology. For example, the minimalistic safety switching device 14 could be arranged without a housing in a shrink tube, in which the two-wire line to the signaling device 12 protrudes on the input side and two connections for the power supply path 52 are provided on the output side. Simply casting with an insulating potting compound is likewise conceivable. In this way, the novel safety circuit arrangement could be integrated particularly well into small individual systems.

What is claimed is:

1. A safety circuit arrangement for failsafe shutdown of an electrically driven installation, the safety circuit arrangement comprising:
   a safety switching device configured to close or disconnect a power supply path to the electrically driven installation in a failsafe manner and
   a signaling device connected to the safety switching device by a first line,
   wherein:
   the signaling device includes:
      an actuator that is interchangeable between a first defined state and a second defined state and
      a signal generator configured to, in response to the actuator being in the first defined state, generate a first clock signal on the first line,
   the safety switching device includes:
      a safety switching relay that has a defined actuating power,
      a transformer that has a primary side and a secondary side, and
      a rectifier,
   the primary side of the transformer is connected to the first line,
   the secondary side of the transformer is connected to the rectifier,
   the rectifier is connected to the safety switching relay, such that only alternating current (AC) components of the first clock signal are converted into electrical power and provided to the safety switching relay, and
   the safety switching relay is configured to be actuated in response to the electrical power from the first clock signal being greater than or equal to the defined actuating power of the safety switching relay.

2. The safety circuit arrangement according to claim 1, wherein the safety switching device is configured to use exclusively the electrical power from the first clock signal for energizing the safety switching relay.

3. The safety circuit arrangement according to claim 1, wherein:
   the signaling device and the safety switching device are additionally connected by a second line;
   the signaling device has a first terminal and a second terminal configured to receive for receiving a supply voltage;
   the signaling device has a third terminal configured to supply the first clock signal;
   the second terminal is connected to the second line; and
   the third terminal is connected to the first line to supply a common potential and the first clock signal to the safety switching device.

4. The safety circuit arrangement according to claim 3, wherein the common potential is a common earth potential.

5. The safety circuit arrangement according to claim 3, wherein the signal generator includes:
   an input connected to the first terminal and the second terminal and
   an output connected to the third terminal.

6. The safety circuit arrangement according to claim 3, wherein:
   the actuator has a first operating contact and a second operating contact;
   the first operating contact is connected to the first terminal and the signal generator; and
   the second operating contact is connected to the signal generator and the third terminal.

7. The safety circuit arrangement according to claim 1, wherein the signal generator includes an oscillator.

8. The safety circuit arrangement according to claim 7, wherein the oscillator is a sine-wave oscillator.

9. The safety circuit arrangement according to claim 1, wherein:
   the signaling device and the safety switching device are connected by the first line and a second line and
   the first line and the second line are each a core of a two-wire line.

10. The safety circuit arrangement according to claim 1, wherein:
    the safety switching relay has a holding power that is lower than the defined actuating power;
    the signal generator is configured to supply a second clock, signal; and
    the safety switching device is configured to:
       draw an electrical power from the second clock signal that is greater than or equal to the holding power of the safety switching relay but is lower than the defined actuating power of the safety switching relay and
       convert the electrical power to direct current (DC) for holding the safety switching relay.

11. The safety circuit arrangement according to claim 10, wherein the signal generator is configured to, in response to the actuator being shifted from the second defined state to the first defined state:
    supply the first clock signal for a defined period of time and
    after the defined period of time, supply the second clock signal for as long as the actuator is in the first defined state.

12. The safety circuit arrangement according to claim 11, wherein the defined period of time is 20 to 200 milliseconds.

13. The safety circuit arrangement according to claim 1, wherein:
    the safety switching device has a holding power that is lower than the defined actuating power and
    the safety switching device is configured to:
       after, actuating the safety switching relay, reduce energy of the first clock signal such that an electrical power is drawable from the first clock signal by the safety switching device, wherein the drawable electrical power is greater than or equal to the holding power of the safety switching relay but is lower than the defined actuating power and
       convert the electrical power to direct current (DC) for holding the safety switching relay.

14. The safety circuit arrangement according to claim 1, wherein:
    the safety switching relay is a double-armature relay and
    the double-armature relay has two separate contact sets and a single coil.

15. A safety switching device for a safety circuit arrangement for failsafe shutdown of an electrical installation, the safety switching device comprising:
- a first input and a second input configured to receive a first line and a second line, respectively, by which the safety switching device is connectable to a signaling device to receive a first clock signal;
- a safety switching relay having a defined actuating power;
- a transformer that has a primary side and a secondary side; and
- a rectifier, wherein:
- the primary side of the transformer is connected to the first input,
- the secondary side of the transformer is connected to the rectifier,
- the rectifier is connected to the safety switching relay, such that only alternating current (AC) components of the first clock signal are converted into electrical power and provided to the safety switching relay, and
- the safety switching relay is configured to be actuated in response to the electrical power from the first clock signal being greater than or equal to the defined actuating power of the safety switching relay.

* * * * *

UNITED STATES PATENT AND TRADEMARK OFFICE
CERTIFICATE OF CORRECTION

PATENT NO. : 10,847,963 B2  
APPLICATION NO. : 15/844856  
DATED : November 24, 2020  
INVENTOR(S) : Jürgen Pullmann Page 1 of 1

It is certified that error appears in the above-identified patent and that said Letters Patent is hereby corrected as shown below:

In the Claims

Claim 3, Column 13, Line 56 "receive for receiving" should be --receive--

Claim 10, Column 14, Line 28 "clock, signal" should be --clock signal--

Claim 13, Column 14, Line 54 "after, actuating" should be --after actuating--

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*